March 14, 1967 W. A. LACHER 3,309,530

RINGING TRIGGER FOR FLIP-FLOP INCORPORATING UNIDIRECTIONALLY CONDUCTIVE BLOCKING AND LEVEL-SHIFTING MEANS

Filed Sept. 26, 1963

INVENTOR.
WILLIAM A. LACHER

BY

Vincent L. Carney
ATTORNEY

United States Patent Office 3,309,530

Patented Mar. 14, 1967

3,309,530

RINGING TRIGGER FOR FLIP-FLOP INCORPORATING UNIDIRECTIONALLY CONDUCTIVE BLOCKING AND LEVEL SHIFTING MEANS

William A. Lacher, North Wales, Pa., assignor to Burroughs Corporation, Detroit, Mich., a corporation of Michigan Filed Sept. 26, 1963, Ser. No. 311,800
12 Claims. (Cl. 307—88.5)

This invention relates to flip-flops and more particularly, to apparatus and methods for rapidly triggering flip-flops without time race occurrence.

Flip-flops or bistable multivibrators are devices which will provide a voltage output at a different one of two locations each time they are triggered by an input pulse. These devices have wide application in the electronic arts and particularly in computers. In computer applications it is desirable for these flip-flops to be capable of very rapid operation since this will improve the speed of the computer. Trigger circuits are utilized to provide pulses having the proper characteristics for rapid switching of these flip-flops.

The triggering circuits that are used to switch flip-flops occasionally cause an accidental switching action to take place. Accidental switching may occur because of a variation in the input voltage to the trigger circuit or because the flip-flop switches both on the leading edge of the input pulse and on its trailing edge so as to provide an extra switching action. This accidental switching of the flip-flop is called time race. Increased circuit elements are frequently necessary to reduce the time race problem, thus complicating the computer and making it more expensive.

Accordingly, it is a purpose of this invention to provide an improved flip-flop.

It is a further purpose of this invention to provide a trailing edge trigger for flip-flops which will reduce time race occurrence.

It is a still further purpose of this invention to provide a rapidly operating flip-flop which is free from time race occurrence and has a minimum of circuit components.

In accordance with the above objects an input pulse, which has a polarity opposite that necessary to switch a transistorized flip-flop, is applied to a triggering circuit. The triggering circuit has an inductor-capacitor "ringing" circuit. This "ringing" circuit is damped so that it provides one strong cycle of oscillation of the same wave length as the input pulse each time it receives an input pulse. The first half cycle of this oscillation has a polarity opposite that necessary to switch the flip-flop. This half cycle is blocked by a diode leading into the flip-flop. The second half cycle of oscillation, however, is passed by the diode and switches the flip-flop by turning off one of its output transistors.

The invention and the above noted and other features thereof will be understood more clearly and fully from the following detailed description with reference to the accompanying drawings in which.

Figure 1:
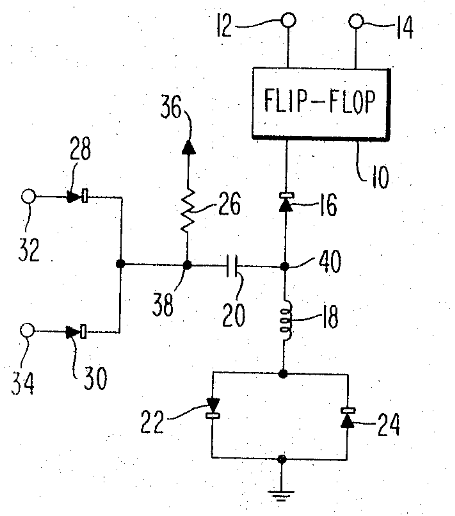
FIGURE 1 is a simplified schematic circuit diagram of a trigger embodying the present invention.

With reference in particular to FIGURE 1 there is shown a schematic circuit diagram of a flip-flop 10, having a first output terminal 12 and a second output terminal 14 electrically connected to it. The cathode of a diode 16 is electrically connected to an input of the flip-flop 10; the anode of the diode 16 is connected to a terminal 40. The terminal 40 is connected to one end of an inductor 18 and to one plate of a capacitor 20. The other end of the inductor 18 is connected to the anode of a diode 22 and to the cathode of a diode 24. The other plate of capacitor 20 is connected to terminal 38. Terminal 38 is electrically connected to one side of a resistor 26, to the cathode of a diode 28, and to the cathode of a diode 30. The cathode of the diode 22 and the anode of the diode 24 are grounded. The anode of the diode 28 is electrically connected to a logic input terminal 32; the anode of the diode 30 is electrically connected to a clock pulse input terminal 34. The other end of resistor 26 is connected to a negative source of potential 36.

The diode 28, the diode 30, the resistor 26, and the source of negative potential 36 form a logical AND gate. When there is no input to either the logic input terminal 32 or to the clock pulse input terminal 34, current will flow through one of the diodes 28 or 30 through the resistor 26 to the source of negative potential 36. The voltage drop caused by this current flow across resistor 26 holds the potential at terminal 38 near ground level. When a negative voltage is applied to logic input terminal 32 concurrently with a negative clock-pulse voltage at terminal 34, the flow of current through resistor 26 is arrested and the potential of terminal 38 falls toward the negative potential of the voltage source 36.

When the resonant frequency of the capacitor 20 and the inductor 18 is equal to or greater than the frequency of the clock pulse applied to terminal 34, the negative voltage pulse from terminal 38 is transmitted to terminal 40, with no phase shift and with a voltage gain equal to or greater than one. When the clock pulse frequency is the higher, the negative voltage pulse is also applied at the resonant frequency although somewhat shifted in phase from said clock pulse. This negative voltage at terminal 40 blocks the diode 16. It is dropped across this diode and does not affect the flip-flop 10, the input of which is connected to the cathode of the diode 16.

However, this negative voltage starts the "ringing" circuit, which is comprised of the capacitor 20 and the inductor 18, oscillating. The first positive voltage excursion of this oscillation occurs immediately after the negative voltage pulse is transmitted from terminal 38. It is passed by the diode 16 and switches the flip-flop 10 from one state to the other. The next negative excursion in this oscillation is damped by the forward resistance of diode 24 so as to not have a significant effect on the circuit.

The diodes 22 and 24 are utilized for damping the oscillation of the "ringing" network. It can be seen that only the diode 24 is necessary. However the combination of the diode 22 and 24 provides a better result. The effectiveness of the damping action provided by the diodes 22 and 24 is increased by the non-linear nature of their foward resistances.

Figure 2:
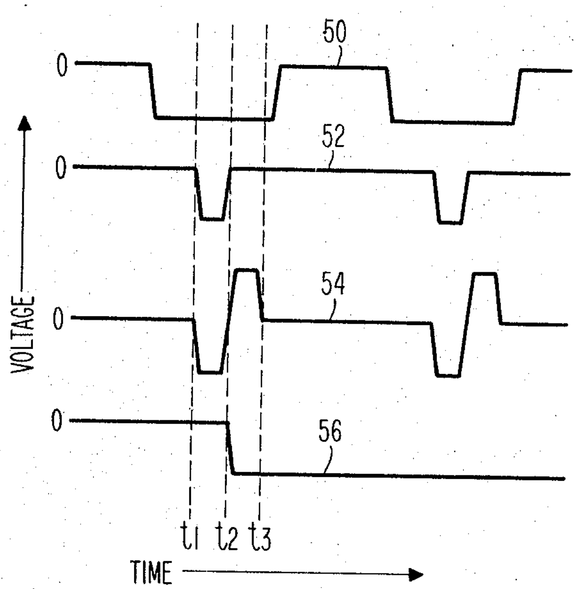
FIGURE 2 is a graph of voltage waveforms that appear at different locations in the circuit of this invention, each having separate ordinates of voltage and common abscissas of time.

In FIGURE 2 a graph is shown comparing the voltage waveforms which occur at the input terminals of the trigger, at the anode of the switching transistor which leads to the input of the flip-flop, and at one of the output terminals of the flip-flop. The curves each have separate ordinates indicating voltage, but have the same abscissas indicating time.

The curve 50 represents the voltage applied to the input logic terminal 32. This voltage is at ground potential at the ordinate and falls to a negative three volts before time $t_1$. It rises again to ground potential at some time after $t_3$. This negative pulse represents one bit of information from a logic network. It is indicated as going through another cycle in the same graph.

The curve 52, shown directly below the curve 50, represents the voltage applied to the clock input terminal 34. A clock input pulse is shown as occurring between times $t_1$ and $t_2$ as the curve drops between a value indicated as ground level to a negative three volts potential. A second clock cycle is shown in the same graph.

The clock pulse indicated by curve 52 synchronizes information flow to the flip-flop. Since both the logic input pulse and the clock pulse occur between times $t_1$ and $t_2$ both of the diodes 28 and 30 are affected causing a negative voltage pulse to appear at terminal 38. This negative voltage pulse is transmitted through capacitor 20 to terminal 40.

The voltage waveforms at terminal 40 are indicated by curve 54, which is directly below curve 52. Between times $t_1$ and $t_2$ the negative voltage pulse that was transmitted from terminal 38 is shown. The energy from this pulse is stored in the inductor 18. When the clock pulse is terminated and the voltage at terminal 38 begins to rise, the inductor 18 releases this stored energy in the form of a positive pulse between times $t_2$ and $t_3$. This positive voltage pulse switches the flip-flop 10 so that a negative voltage appears at terminal 12 and terminal 14 rises to ground level. The previous negative voltage was blocked by diode 16 so as to not affect the flip-flop 10. The remaining energy in the "ringing" circuit formed by the capacitor 20 and the inductor 18 is dissipated in the non-linear forward resistance of the diodes 22 and 24.

The curve 56 which is directly under the curve 54 represents the output voltage appearing at terminal 12 of the flip-flop 10. The voltage at terminal 12 drops from ground potential to a negative three volts starting at time $t_2$. Terminal 12 remains at this potential until the flip-flop is again switched. It is noted that the switching does not take place until after the clock pulse has terminated thus eliminating time race occurrence due to variations in the pulses during the time width of the clock pulse.

Figure 3:
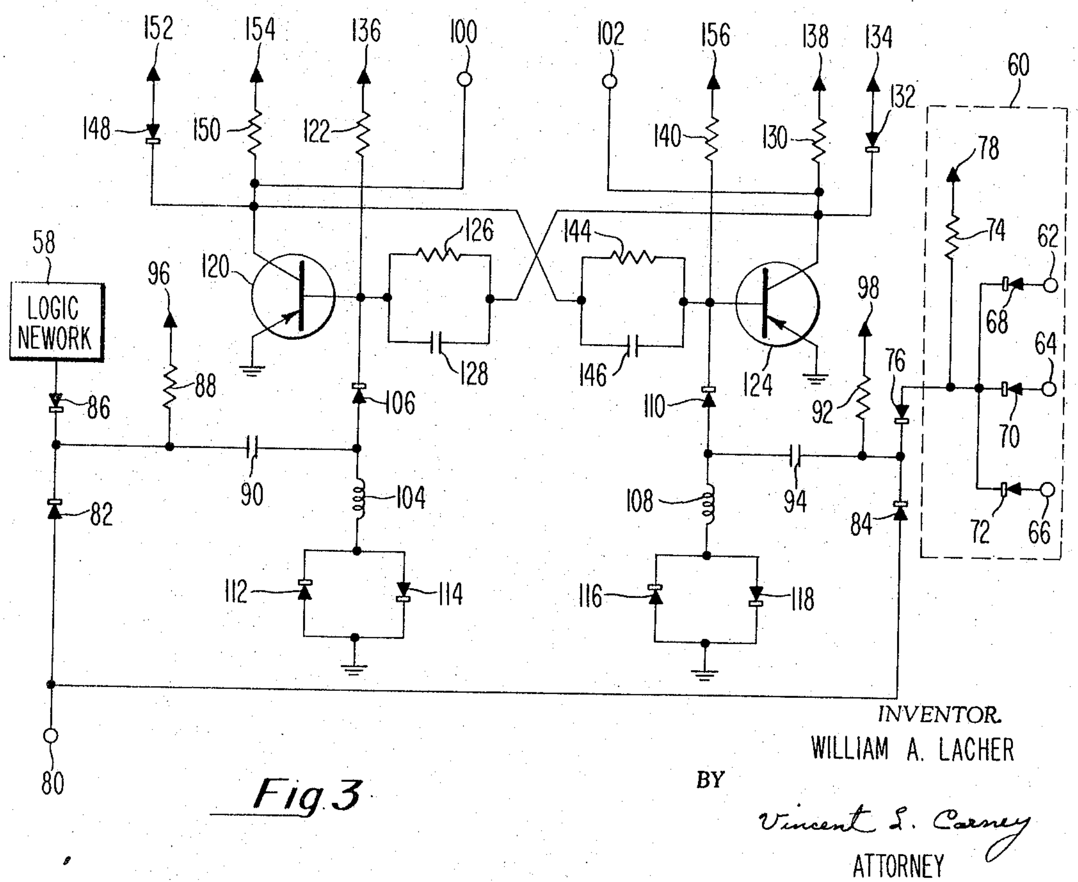
FIGURE 3 is a schematic circuit diagram of a complementary flip-flop, two triggers for this flip-flop, and gating circuitry, which together form an embodiment of the invention.

Referring now in particular to FIGURE 3 a complementary flip-flop that is an embodiment of this invention is shown, having inputs from the logic networks 58 and 60. The logic network indicated generally at 60 is a negative AND gate having input terminals 62, 64, and 66. The input terminals 62, 64 and 66 are electrically connected to the anodes of diodes 68, 70 and 72 respectively; the cathodes of diodes 68, 70, and 72 are electrically connected to each other, to one end of resistor 74, and to the anode of diode 76. The other end of resistor 74 is electrically connected to the negative voltage source 78.

The logic network indicated generally at 60 performs a logical AND function. This means that if any one of the terminals 62, 64 or 66 are at a ground potential, or at a positive potential, the anode of diode 76 will also be at a potential that is close to ground. This is because the negative potential from the source 78 is primarily dropped across resistor 74 due to the flow of current from the terminals to the voltage source. However, if a negative voltage pulse is applied to each of the terminals 62, 64, and 66, each of the diodes 68, 70, and 72 will be affected so as to reduce current flow through the resistor 74. In this case the voltage at the anode of diode 7 will be driven to a substantially negative potential.

The logical AND gate shown generally at 60 is only an illustration. Many other types of logic networks could be used without deviating from the invention. Similarly, many different kinds of logic networks could be used in place of the logic network 58, which provides an input for the other terminal of the flip-flop.

A clock pulse input terminal 80 is electrically connected to the anode of diode 82 and to the anode of diode 84. The output from the logic network 58 is connected to the anode of diode 86. The cathodes of diodes 86 and 82 are electrically connected together, to one end of resistor 88, and to one plate of the capacitor 90;

the cathodes of diodes 76 and 84 are electrically connected together, to one end of the resistor 92, and to one plate of the capacitor 94. The other end of resistor 88 is connected to the negative source of potential 96 and the other end of resistor 92 is connected to the negative source of potential 98.

A negative clock pulse is periodically applied to the clock pulse input terminal 80 so as to synchronize the operation of the flip-flop. When a negative pulse is applied to the anode of diode 86 by the logic network 58 concurrently with a clock pulse on terminal 80 the flip-flop will be set so as to provide the negative voltage output at output terminal 100; when a negative pulse is applied to the anode of diode 76 by the logic network 60 concurrently with a clock pulse on terminal 80 the flip-flop will be reset so as to provide a negative output at the other output terminal 102 and to raise the voltage of the output terminal 100 back to ground level.

This occurs because a negative pulse at the anode of diodes 86 and 82 affects both of these diodes so as to drive the potential at the junction between resistor 88 and capacitor 90 to a substantially negative potential. A negative input pulse at the anodes of diodes 76 and 84 will operate in the same manner so as to drive the potential between the junction of capacitor 94 and resistor 92 to a negative potential.

The other plate of capacitor 90 is electrically connected to one end of the inductor 104 and to the anode of diode 106; the other plate of capacitor 94 is connected to one end of inductor 108 and to the anode of diode 110. The other end of inductor 104 is connected to the cathode of diode 112 and to the anode of diode 114; the other end of inductor 108 is connected to the cathode of diode 116 and to the anode of diode 118. The anodes of diodes 112 and 116 and the cathodes of diodes 114 and 118 are each grounded.

The negative pulse that appears at the junction of the resistor 88 and the capacitor 90 due to the concurrence of an input pulse of logic network 58 and a clock pulse on terminal 80 is transmitted through capacitor 90 to the junction of diode 106 and inductor 104. This negative pulse is blocked by diode 106 and part of the energy from it is stored by inductor 104. When the clock pulse, which has been applied to terminal 80, begins to decrease, the energy stored in inductor 104 which is released in the form of a positive pulse, is passed through the diode 106 so as to switch the flip-flop. The remaining energy in the circuit is damped by the non-linear forward resistances of the diodes 112 and 114. In the same way a negative pulse that appears at the junction of resistor 92 and capacitor 94 because of the concurrence of an input pulse from logic network 60 with a clock pulse on terminal 80 will result in a positive pulse being transmitted through the diode 110 to reset the flip-flop.

The cathode of diode 106 is connected to the base of PNP transistor 120, to one end of resistor 122, and to the collector of PNP transistor 124. The electrical connection from the cathode of diode 106 to the collector of transistor 124 is made through the parallel connection of resistor 126 and capacitor 128. The collector of transistor 124 is also electrically connected to one end of resistor 130, to output terminal 102, and to the cathode of diode 132. The anode of diode 132 is connected to a negative source of potential 134. The other end of resistor 122 is connected to a positive source of potential 136 and the other end of resistor 130 is connected to a negative source of potential 138.

The cathode of diode 110 is electrically connected to the base of transistor 124, to one end of resistor 140, and to the collector of transistor 120. The connection from the cathode of diode 110 to the collector of transistor 120 is made through the parallel combination of resistor 144 and capacitor 146. The collector of transistor 120 is also connected to the cathode of diode 148, to one end of resistor 150, and to the output terminal 100. The anode of diode 148 is connected to the negative source of potential 152. The other end of resistor 150 is connected to the negative source of potential 154 and the other end of resistor 140 is connected to the positive source of potential 156.

When a positive pulse is passed by the diode 106 due to the concurrence of a logic input pulse from the logic network 58 with a clock pulse, the transistor 120 is switched off. This causes the collector of this transistor to be driven to a negative voltage approaching that of the negative source 154 by reducing the voltage drop across resistor 150. However, the collector voltage is clamped to the source of negative potential 152 by the diode 148. The negative potential from the collector of transistor 120 appears at output terminal 100 indicating that the flip-flop is set. It also appears at the base of transistor 124, which is connected to the collector of transistor 120 through the cross-over network.

This negative voltage switches transistor 124 into its conducting state causing its collector to rise towards a ground level. The ground level voltage at the collector of transistor 124 replaces the negative output voltage at output terminal 102 and is also conducted to the base of transistor 120 so as to hold this transistor in the nonconducting state. In a similar manner a positive pulse conducted by diode 110 due to the concurrence of an input pulse from logic network 60 and the clock pulse will switch transistor 124 off causing the flip-flip to be reset. This means that a negative voltage will now appear at output terminal 102 and a ground level voltage at terminal 100. Also the transistor 120 will be switched into the conducting state and held there.

Some typical values of the perimeters of a circuit such as that in FIGURE 3 are given below:

| | |
|---|---|
| All diodes: | Type T6G |
| Transistors **120** and **124** | Philco 2N393. |
| Voltage sources **152** and **134** | Negative 3 volts. |
| Voltage sources **96, 154, 138, 98** | Negative 15 volts. |
| Voltage sources **156** and **136** | Positive 15 volts. |
| Inductors **104** and **108** | 33 micro-henries. |
| Capacitors **90** and **94** | 120 micro-micro-farads. |
| Capacitors **128** and **146** | 51 micro-micro-farads. |
| Resistors **88** and **92** | 6.8 kilohms. |
| Resistors **150, 130** | 1.5K. |
| Resistors **122, 140** | 100K. |
| Resistors **126, 144** | 3K. |

The above circuit will work at 5 mc. (megacycles). However, if type 2N706 NPN transistors are used the circuit may be complemented at 10 mcs. It may be desirable to use silicon diodes for 106 and 110 rather than the germanium type. This insures that a shunt path through these diodes does not rob the associated transistors of emitter-to-base current for turn-on purposes since the silicon diodes have a higher foward voltage drop than the germanium transistors which have been suggested.

It can be seen that a compact and economical flip-flop that is capable of very rapid operation may be made in accordance with the teachings of this invention. Either complementing or non-complementing flip-flops may be constructed with only two transistors. Operation up to ten mcs. may be obtained. The use of this resonant circuit-driven turn-off method permits the use of cheap transistors which normally suffer from hole storage. Such flip-flops as hereinabove described, are free of time race since switching takes place on the trailing edge.

Obviously many modifications and variations of the present invention are possible in the light of the above teachings. It is therefore to be understood that within the scope of the appended claims, the invention may be practiced otherwise than as specifically described.

What is claimed is:

1. Apparatus for switching an active circuit element from one state to another comprising:

an input terminal adapted to receive a first trigger pulse;

resonant pulse forming means, electrically connected to said input terminal, for converting the energy from said first trigger pulse to a series of oscillatory pulses including a second pulse having a polarity opposite to that necessary to switch said circuit element from one state to the other and to a third pulse of the polarity necessary to switch said circuit element from one state to another and of substantially the same width as said second pulse;

unidirectional means, electrically connected to said pulse forming means, for blocking said second pulse and passing said third pulse, and an output terminal, electrically connected to said unidirectional means, adapted to provide said active circuit element with said third pulse.

2. The combination comprising:

an input terminal adapted to receive a first voltage pulse;

ringing trigger means, electrically connected to said input terminal, for generating a plurality of oscillatory pulses including a second voltage pulse having a leading edge which corresponds in time to the leading edge of said first voltage pulse and for generating a third voltage pulse having a leading edge which corresponds in time with the trailing edge of said first voltage pulse;

unidirectional means, electrically connected to said trigger means, for blocking said second voltage pulse and for passing said third voltage pulse; and a multivibrator having its input electrically connected to said unidirectional means, whereby said multivibrator is switched from one state to another by said third voltage pulse.

3. The combination comprising:

an input terminal adapted to receive a first pulse;

resonant circuit means, electrically connected to said input terminal, for generating oscillatory pulses of alternate polarities, each having a time-width equal to that of said first pulse upon receiving one of said first pulses from said input terminal;

unidirectional damping means, electrically connected to said resonant circuit means, for non-linearly conducting current of at least one polarity and reducing the amplitude of said oscillatory pulses progressively from the time said first pulse is received by said resonant circuit means so that only a first of said oscillatory pulses of a second polarity remains substantially undiminished;

unidirectional means, electrically connected to said resonant circuit means, for blocking those oscillatory pulses having said one of two polarities; and a multivibrator, electrically connected to said unidirectional means, adapted to be triggered by pulses having a second of said two polarities.

4. A trigger for a flip-flop comprising:

an input terminal adapted to receive a first voltage pulse having a polarity opposite to that necessary to switch said flip-flop;

resonant pulse generating means, electrically connected to said input terminal, for receiving said first pulse and for generating a plurality of oscillatory pulses including a second pulse of opposite polarity immediately following said first pulse in time;

unidirectional means, electrically connected to said pulse generating means, for passing pulses of the polarity of said second pulse; and an output terminal electrically connected to said unidirectional means adapted to provide said second pulse to said flip-flop.

5. A trigger for a flip-flop according to claim 4 in which said resonant pulse generating means comprises:

an oscillating network electrically connected to said input terminal and to said unidirectional means, and unidirectional damping means, electrically connected to said oscillating network, for non-linearly conducting current of at least one polarity and progressively reducing the amplitude of the voltage oscillations in said oscillating network so that only one pulse of the second polarity of the pulses from said oscillating network is sufficient to trigger the flip-flop, thereby precluding false triggering of said flip-flop.

6. A trigger for a flip-flop according to claim 5 in which said oscillating network comprises:

a capacitor having one plate electrically connected to said input terminal; and an inductor having one end electrically connected to the other plate of said capacitor and having its other end electrically connected to said damping means.

7. A trigger for a flip-flop according to claim 6 in which said damping means comprises a semi-conductor diode having its cathode electrically connected to one end of said inductor and having its anode grounded.

8. A trigger for a flip-flop comprising:

a logic input terminal coupled to receive first voltage pulses from a logic network;

a clock pulse input terminal coupled to receive synchronizing clock voltage pulses;

gate means, electrically connected to said logic input terminal and to said clock pulse input terminal, for generating a second voltage pulse upon receiving one of said first voltage pulses from said logic input terminal concurrently with one of said clock voltage pulses from said clock pulse input terminal;

resonant pulse generating means, electrically connected to said gate means, for generating third and fourth serial oscillatory voltage pulses of opposite polarities upon receiving one of the second voltage pulses from said gate means; and unidirectional conducting means, electrically connected to said pulse generating means, for conducting pulses of only one polarity from said pulse generating means to said flip-flop for triggering said flip-flop.

9. A trigger for a flip-flop according to claim 8 in which said resonant pulse generating means comprises:

an oscillating network electrically connected to said gate means and to said unidirectional conducting means;

said oscillating network having a resonant frequency equal to or less than the frequency of said clock pulses; and a damping network electrically connected between said oscillating network and ground.

10. A trigger for a flip-flop according to claim 9 in which said oscillating network comprises:

a capacitor having one plate electrically connected to said gate means; and an inductor having one end electrically connected to the other end of said capacitor and also to said unidirectional conducting means and having its other end connected to said damping network.

11. An anti-time race flip-flop comprising:

a logic input terminal adapted to receive voltage pulses from a logic network;

a clock pulse input terminal adapted to receive clock pulse voltages;

an AND gate electrically connected to said input terminal and to said clock pulse terminal whereby an AND output pulse is generated each time said AND gate receives a pulse from said logic network concurrently with a pulse from said clock pulse terminal;

a capacitor having one plate electrically connected to said AND gate and having its other plate electrically connected to a switching terminal;

an inductor having one end electrically connected to said switching terminal;

said inductor and capacitor being resonant at a frequency that is equal to or less than the frequency of the clock pulses supplied to said clock pulse terminal;

the other end of said inductor being electrically connected to a damping network whereby the oscillations in said capacitor and inductor are substantially attenuated after one cycle of oscillation;

a unidirectional device having its anode electrically connected to said switching terminal whereby negative voltage oscillations from said inductor and capacitor are dropped across said unidirectional device and positive oscillations are passed by said unidirectional device; and a transistorized bistable device having an input terminal electrically connected to the cathode of said unidirectional device, whereby said bistable device is switched from one state to the other by positive voltage pulses passed by said unidirectional device.

12. An anti-time race flip-flop comprising:

first and second logic input terminals;

a terminal for receiving synchronizing clock pulses;

a first AND gate electrically connected to said first logic input pulse terminal and to said clock pulse-receiving terminal, whereby a first AND voltage pulse is generated upon the concurrence of an input pulse at said first logic input terminal and with a clock pulse at the clock pulse-receiving terminal;

a second AND gate electrically connected to said second logic input pulse terminal and to said clock pulse-receiving terminal, whereby a second AND voltage pulse is generated upon the concurrence of an input pulse at said second logic input pulse terminal with a clock pulse at the clock pulse-receiving terminal;

a first capacitor having one plate electrically connected to said first AND gate;

a second capacitor having one plate electrically connected to said second AND gate;

a first inductor having a first end electrically connected to the other end of said first capacitor;

a second inductor having a first end electrically connected to the other end of said second capacitor;

a first diode having its cathode electrically connected to the second end of said first inductor and having its anode grounded;

a second diode having its cathode electrically connected to the second end of said second inductor and having its anode grounded;

a third diode having its anode electrically connected to the first end of said first inductor;

a fourth diode having its anode electrically connected to the first end of said second inductor;

a first PNP transistor having its emitter grounded, its collector electrically connected to a negative source of potential through a resistance, and to a first cross-over network, and having its base electrically connected to the cathode of said third diode and to a second cross-over network;

a second PNP transistor having its emitter grounded, its collector electrically connected to a negative source of potential through a resistor, and to said second cross-over network and having its base electrically connected to the cathode of said fourth diode and to said first cross-over network;

a first output terminal electrically connected to the collector of said first transistor, whereby a negative voltage appears at said first output terminal when said first transistor is turned off by a positive voltage pulse passed by said third diode from said first inductor and capacitor; and a second output terminal electrically connected to the collector of said second transistor, whereby a negative output voltage appears at said second output terminal in response to the turning off of said second transistor by a positive voltage pulse passed through said fourth diode from said second inductor and capacitor.

References Cited by the Examiner

UNITED STATES PATENTS

| | | | |
|---|---|---|---|
| 2,816,237 | 12/1957 | Hageman | 307—88.5 |
| 3,036,223 | 5/1962 | Phillips | 307—88.5 |
| 3,102,208 | 8/1963 | Reach | 307—88.5 |
| 3,115,583 | 12/1963 | Hinkein | 307—88.5 |
| 3,146,355 | 8/1964 | Clapper. | |
| 3,152,267 | 10/1964 | Clapper. | |
| 3,171,039 | 2/1965 | Lorenz | 307—88.5 |
| 3,174,055 | 3/1965 | Clapper. | |
| 3,193,704 | 6/1965 | Chueh | 307—88.5 |

ARTHUR GAUSS, *Primary Examiner.*

R. H. EPSTEIN, *Assistant Examiner.*